United States Patent
Kaloyeros et al.

(10) Patent No.: US 12,398,469 B2
(45) Date of Patent: Aug. 26, 2025

(54) METHODS AND SYSTEMS FOR PRODUCING CONFORMAL THIN FILMS

(71) Applicant: KALARK NANOSTRUCTURE SCIENCES INC., Doylestown, PA (US)

(72) Inventors: Alain E. Kaloyeros, Slingerlands, NY (US); Barry C. Arkles, Pipersville, PA (US)

(73) Assignee: KALARK NANOSTRUCTURE SCIENCES INC., Doylestown, PA (US)

( * ) Notice: Subject to any disclaimer, the term of this patent is extended or adjusted under 35 U.S.C. 154(b) by 0 days.

(21) Appl. No.: 18/956,091

(22) Filed: Nov. 22, 2024

(65) Prior Publication Data
US 2025/0163584 A1    May 22, 2025

Related U.S. Application Data

(60) Provisional application No. 63/601,966, filed on Nov. 22, 2023.

(51) Int. Cl.
*C23C 28/02* (2006.01)
*C23C 14/34* (2006.01)
*C23C 16/455* (2006.01)

(52) U.S. Cl.
CPC .......... *C23C 28/02* (2013.01); *C23C 14/3407* (2013.01); *C23C 16/45525* (2013.01)

(58) Field of Classification Search
CPC ................ C23C 28/02; C23C 14/3407; C23C 16/45525
See application file for complete search history.

(56) References Cited

U.S. PATENT DOCUMENTS

| 6,350,353 B2* | 2/2002 | Gopalraja ............. H01J 37/321 204/192.12 |
| 6,841,044 B1 | 1/2005 | Ruzic |
| 2003/0150713 A1 | 8/2003 | Kado |
| 2018/0096842 A1* | 4/2018 | Varadarajan .......... C23C 16/325 |
| 2020/0318236 A1 | 10/2020 | Arkles et al. |

(Continued)

OTHER PUBLICATIONS

Chen et al., Atomic mobilities, diffusion coefficients, and kinetic coefficients in Ti-rich Ti—Mo—Nb system, CALPHAD: Computer Coupling of Phase Diagrams and Thermochemistry, vol. 84, No. 102654, pp. 1-10 (2024), cited in the specification.

(Continued)

*Primary Examiner* — Kelly M Gambetta
(74) *Attorney, Agent, or Firm* — Panitch Schwarze Belisario & Nadel LLP

(57) ABSTRACT

Thin film deposition procedures and systems are provided that consist of hybrid growth processes or integrated physical-chemical deposition processes that combine and unite the advantages of physical (i.e., sputtering) and chemical (i.e., CVD, ALD, MLD, SAM, and/or Click) deposition processes, while minimizing or eliminating their individual shortcomings and challenges. These methods and techniques therefore provide a common and shared processing platform that employs both chemical and physical reactions simultaneously or sequentially to grow high quality conformal thin films with programmable composition and controlled properties.

28 Claims, 2 Drawing Sheets

(56) References Cited

U.S. PATENT DOCUMENTS

2022/0119940 A1   4/2022   Arkles et al.
2023/0187530 A1*  6/2023   Huang ................. H10D 64/021
                                                        257/288

OTHER PUBLICATIONS

Gibson et al., "Determination of the sticking coefficient and scattering dynamics of water on ice using molecular beam techniques," The Journal of Chemical Physics, vol. 134, No. 034703. pp. 1-5 (2011), cited in the specification.
Kaloyeros et al., "Emerging Molecular and Atomic Level Techniques for Nanoscale Applications," The Electrochemical Society Interface, vol. 27, No. 4, pp. 61-65 (2018), cited in the specification.
Ortino, M., "Sticking Coefficients for Technical Materials in Vacuum Technology," Masters Thesis, Politecnico di Milano, Master Degree in Nuclear Engineering, pp. 1-115 (2016), cited in the specification.
Xia et al., "Evaluating atomic mobility and interdiffusivity based on two-dimensional diffusion simulations and diffusion triple experiments ," Scripta Materialia, vol. 188, pp. 124-129 (2020), cited in the specification.
International Search Report and Written Opinion issued May 9, 2025 in International Application No. PCT/US2024/056999.
Kim et al., "Reflow Characteristics of Copper in an Oxygen Ambient," Key Engineering Materials, vols. 270-273, pp. 820-825 (2004).
Motoyama et al., "PVD Cu Reflow Seed Process Optimization for Defect Reduction in Nanoscale Cu/Low-k Dual Damascene Interconnects," Journal of The Electrochemical Society, vol. 160, No. 12, pp. D3211-D3215 (2013).

\* cited by examiner

METHODS AND SYSTEMS FOR PRODUCING CONFORMAL THIN FILMS

CROSS REFERENCE TO RELATED APPLICATION

This application claims priority to co-pending U.S. provisional patent application No. 63/601,966, filed Nov. 22, 2023, the disclosure of which is herein incorporated by reference in its entirety.

BACKGROUND OF THE INVENTION

Sputtering, a form of physical vapor deposition (PVD), has historically been the most widely used workhorse for thin film and coating deposition across multiple industries. In many ways, sputtering represents an evolution from a prior PVD technique, evaporation. Evaporation is based on two fundamental components: (i) a material source heated to a temperature that vaporizes the material; and (ii) a substrate heated to a temperature lower than the material melting point where the evaporated material condenses to form a thin film. Conversely, sputtering is based on the ejection or expulsion of a material in the form of ions, atoms and/or molecular clusters from a source, commonly referred to as a "target," due to the impingement of atoms and/or ions from a plasma. The ejected species are directed to a substrate where they form a film or a coating on the substrate. Species emitted from the target tend to exhibit a wide energy distribution, with values that can reach tens of eVs (the equivalent of 100,000K).

The sputtering phenomena can also be accompanied by re-sputtering or re-emission of the deposited material during the growth process due to ionic or atomic bombardment either from the plasma or from ions emitted from the target. At lower processing pressures, the latter are typically a minute percentage of the emitted particles from the target but can ballistically travel from the target and collide energetically with the substrate or deposition chamber walls. At higher processing pressures, ions ejected from the target tend to collide instead with plasma gas particles and may impinge on the substrate or reactor walls at lower energies and condense after undertaking what is commonly referred to as "random walk." The entire spectrum, ranging from high-energy ballistic impact to low-energy thermalized motion for target ions, is accessible by changing the plasma gas pressure. The sputtering gas is often an inert gas, such as argon or xenon. For effective momentum transfer to the sputtering target atoms, the atomic weight of the sputtering gas should be close to or higher than the atomic weight of the target atoms. In general, for sputtering lighter elements, argon is preferable, while for heavier elements, krypton, and xenon are preferred.

Sputtering sources often employ magnetrons that utilize strong electric and magnetic fields to confine charged plasma particles close to the surface of the sputtering target. In a magnetic field, electrons follow helical paths around magnetic field lines, undergoing more ionizing collisions with gaseous neutrals near the target surface than would otherwise occur. As the target material is depleted, a "racetrack" erosion profile may appear on the surface of the target. The sputtered atoms are typically neutrally charged and so are unaffected by the magnetic trap. For conducting targets, direct current (DC) sputtering can be effective. However, charge build-up occurs on insulating targets and may be avoided by using RF sputtering, in which the anode-cathode bias alternates at a very high rate (typically 13.56 MHz). RF sputtering works well to produce highly insulating films, but with the added expense of RF power supplies and impedance matching networks. Stray magnetic fields leaking from ferromagnetic targets also disturb the sputtering process. Specially designed sputter guns with unusually strong permanent magnets must often be used to compensate for this effect.

Reactive gases may also be used to sputter multi-component compounds. Such compounds may be formed on the target surface, in the plasma above the target, or on the substrate, depending on the processing parameters. The availability of many processing parameters that control sputter deposition make it a complex process, but also provides a large degree of control over the growth process and properties of the resulting films.

Over the years, a number of sputtering alternatives have been introduced to further enhance control over process parameters, provide improved step coverage in integrated circuitry (IC), solar cell, and compound semiconductor devices, increase growth rates, and/or enable specific niche industrial applications.

One such technique is ion-beam sputtering (IBS). IBS is a method in which the target is external to the ion source. A source may work without any magnetic field, for example, with a hot filament gauge. In a Kaufman source, ions are generated by collisions with electrons that are confined by a magnetic field, as in a magnetron. They are then accelerated by the electric field emanating from a grid toward a target. As the ions leave the source, they are neutralized by electrons from a second external filament. IBS has an advantage in that the energy and flux of ions may be controlled independently. Since the flux that strikes the target is composed of neutral atoms, either insulating or conducting targets may be sputtered. IBS has found application in the manufacture of thin-film heads for disk drives. A pressure gradient between the ion source and the sample chamber is generated by placing the gas inlet at the source and shooting through a tube into the sample chamber. This saves gas and reduces contamination in ultra-high-vacuum (UHV) applications. One principal drawback of IBS is the large amount of maintenance required to keep the ion source operating.

Another known technique is reactive sputtering, in which the sputtered particles from a target material undergo a chemical reaction, aiming to deposit a film with different composition from the target on a certain substrate. The chemical reaction that the particles undergo is with a reactive gas, such as oxygen or nitrogen, introduced into the sputtering chamber, enabling the production of oxide and nitride films, respectively. The introduction of an additional component to the process, i.e., the reactive gas, has a significant influence on the desired depositions, making it more difficult to find ideal working points. The wide majority of reactive-based sputtering processes are characterized by a hysteresis-like behavior, thus requiring proper control of the involved parameters, e.g., the partial pressure of working (or inert) and reactive gases, to undermine it. The composition of the film can be controlled by varying the relative pressures of the inert and reactive gases. Film stoichiometry is an important parameter for optimizing functional properties such as the stress in silicon oxide and the index of refraction of silicon nitride.

Additional sputtering alternatives include ion-assisted deposition, high-target-utilization sputtering (HiTUS), high-power impulse magnetron sputtering (HiPIMS), and gas flow sputtering. In ion-assisted deposition (IAD), the substrate is exposed to a secondary ion beam operating at a lower power than the sputter gun. Usually a Kaufman source, such as that used in IBS, supplies the secondary beam. IAD may be used to deposit carbon in a diamond-like structure on a substrate. Any carbon atoms landing on the substrate which fail to bond properly in the diamond crystal lattice will be knocked off by the secondary beam. In HiTUS, sputtering is carried out by remote generation of a high-density plasma. The plasma is generated in a side chamber opening into the main process chamber containing the target and the substrate to be coated. As the plasma is generated remotely and not from the target itself (as in conventional magnetron sputtering), the ion current to the target is independent of the voltage applied to the target.

HiPIMS is a method for physical vapor deposition of thin films which is based on magnetron sputter deposition. HiPIMS utilizes extremely high-power densities on the order of $kW/cm^2$ in short pulses (impulses) of tens of microseconds at low duty cycle of <10%. Distinguishing features of HiPIMS are a high degree of ionization of the sputtered metal and a high rate of molecular gas dissociation, which result in high density of deposited films. The ionization and dissociation degree increase according to the peak cathode power. The limit is determined by the transition of the discharge from glow to arc phase. The peak power and the duty cycle are selected in order to maintain an average cathode power similar to conventional sputtering (1-10 $W \cdot cm^{-2}$). HIPIMS is used for: (i) adhesion enhancing pre-treatment of the substrate prior to coating deposition (substrate etching) and/or (ii) deposition of thin films with high microstructure density.

Finally, gas flow sputtering makes use of the hollow cathode effect, the same effect by which hollow cathode lamps operate. In gas flow sputtering, a working gas such as argon is led through an opening in a metal subjected to a negative electrical potential. Enhanced plasma densities occur in the hollow cathode under specific pressure in the chamber and a characteristic dimension of the hollow cathode. This results in a high flux of ions on the surrounding surfaces and a large sputter effect. The hollow-cathode based gas flow sputtering may therefore lead to high deposition rates, up to values of a few µm/min.

Despite all these innovations that have been developed to improve directional and conformal control, including, additionally, long-throw chamber geometries, capacitively coupled substrate holders for wafer bias, and high-temperature reflow of deposited material inside asperities, cavities, vias, channels, and recesses in the substrate, sputtering fundamentally remains a line-of-sight technique. Basically, sputtered species impinge on the substrate from the gas (vapor) phase with a high sticking coefficient and fail to conformally coat the inner portions of topographies etched in the substrate. Coupled with the challenge of achieving low growth rates consistent with tight control of film thickness, this drawback has limited the applicability of sputtering to applications involving thicker films, even in less aggressive topographies.

In contrast, chemical vapor deposition (CVD) offers the advantage of surface driven reactions, which can produce enhanced step coverage in minimum ground-rule features. In typical CVD, the gaseous reactants are transported intact to the substrate surface in thermal CVD growth mechanisms. In some cases, the reaction ultimately leading to deposition takes place in the vapor phase. In plasma-assisted CVD (PA-CVD) and plasma-enhanced CVD (PE-CVD) mechanisms, on the other hand, plasma reactions are followed by transport of the resulting transient reactive species to the surface. The reactants are then adsorbed onto the substrate surface, followed by surface diffusion with potential desorption of some reactants, which is in turn followed by surface reaction with film nucleation and growth in island mode, layer-by-layer (step) mode, or a combination of the two. Finally, the resulting volatile reaction byproducts are emitted from the surface. In thermal CVD, higher substrate temperatures allow for longer surface diffusion lengths, leading to extended surface reaction times and resulting in improved step coverage and reduced contaminant incorporation. Pre-adsorption plasma reactions in PA-CVD or PE-CVD, on the other hand, may allow generation of more active reactant species, resulting in higher surface mobility and reaction rates at lower temperatures, as well as shorter surface diffusion lengths, but yielding films with higher contaminant levels and poorer step coverage.

However, CVD film growth ordinarily proceeds as isolated islands or disconnected layers until a specific thickness is achieved to enable the islands or layers to connect and establish a continuous film. As such, CVD processes do not lead to the formation of extremely thin continuous layers. An additional challenge in CVD is the required tight control of surface reactions to minimize film growth rates in order to precisely control the thickness of extremely thin films.

In this respect, as device design rules approach atomic scale and associated bonding dimensions, deposition processes with inherent control of atomic order become even more critical. As a rather simplistic example of this criticality, a 2 nm-thick binary film (such as $Al_2O_3$, $Si_3N_4$, and GaAs) will consist of only a 10 to 20 atoms-thick layer, which must be deposited uniformly, continuously, and coherently. A number of terms and descriptors are used for these structures, including ultra-thin films, atomic layers, molecular films, near-zero-thickness layers, and monolayers. This evolution has generated tremendous interest in molecular and atomic deposition processes, such as atomic layer deposition (ALD), pulsed CVD, molecular layer deposition (MLD), click chemistry deposition (CCD), and self-assembled monolayer (SAM) deposition.

ALD is categorized by the introduction of the source precursor and co-reactant in sequential (not simultaneous) phases with intervening purge steps to ensure that the co-reactants never cross paths in the reaction zone and that no reactions occur except on the substrate surface. Specifically, a substrate is typically exposed to two reactants AB and XY in a sequential, non-overlapping manner, and each reactant AB, XY reacts with the substrate surface in a self-limited way. As such, reactant AB is first introduced into the reactor to react with the substrate surface. Once all of the accessible reactive sites on the substrate surface have been consumed by the first reactant AB, the growth stops and a purge step is carried out to flush away any remaining reactant molecules. Subsequently, the second reactant XY is inserted into the reactor to react with the reactive sites on the substrate surface and, after all of the accessible sites have been consumed by the second reactant XY, another purge step is carried out to flush away any remaining reactant molecules. The alternating reaction/purge steps constitute one cycle by which a single monolayer of the desired thin film is formed. Alternating exposures of the reactants and purge steps are continued until deposition of the desired thin film is complete.

Using the ALD process, the film growth that proceeds through the self-limiting surface reactions ensures accurate control of film thickness and conformality with atomic level accuracy. These characteristics guarantee the realization of excellent film conformality even in extremely aggressive device topographies. Plasma exposure to one of the co-reactants has been shown to enhance the ALD reaction and increase film growth rates due to the creation of a higher concentration of active co-reactant radicals. Furthermore, the use of plasma to perform surface treatment between the various ALD reaction steps typically leads to higher surface adsorption of source precursor species by maximizing the concentration of active surface sites and decreasing reaction activation energy, leading to lower deposition temperatures.

ALD therefore exhibits several attractive features. Further, in addition to enabling excellent conformality in nanoscale device topographies and feature sizes, ALD tends to grow films that are particle and pin-hole free, while providing excellent management of film thickness down to a few atoms. One of the emerging advantages of thermal cobalt ALD is also its aptitude to enable or prevent area-specific or area-selective film growth, in what is commonly referred to as area-selective ALD. Customized complexes (precursors) and surface assemblies or configurations can be made to react in tightly controlled fashion, enabling catalysis or inhibition of deposition on specific areas of the underlying substrate surface, resulting in film formation only on the desired regions of the substrate.

However, current ALD technologies suffer from high surface roughness and very limited growth rates. The latter drawback presents a serious challenge to the incorporation of ALD into real manufacturing protocols, which require a high system throughput to ensure cost effective processes that produce a competitive cost-of-ownership (COO) and a viable return on investment (ROI).

More recently, work has also been reported on the development and application of what is referred to as pulsed CVD. Pulsed CVD is similar to ALD except that the process is performed at a substrate temperature that leads to partial or complete decomposition of the pulsed precursor upon engagement with the substrate during every exposure cycle, as opposed to being limited to a mere physisorption or chemisorption reaction. A co-reactant is subsequently introduced to complete the decomposition reaction and/or remove the reaction byproducts to ensure a clean film. However, current pulsed CVD technologies suffer from the occurrence of uncontrollable precursor decomposition effects due to partial reaction with the substrate, which introduces undesirable contaminants into the resulting film. They are also plagued by the same issues as ALD, namely, very limited growth rates and thus low manufacturing throughput.

In other words, due to the very low growth rates associated with each ALD or pulsed CVD cycle, an extremely large number of cycles and, as a result, very long deposition times, are required to achieve the target thickness in the final thin film product. In some cases, the deposition process is known to take hours to reach the desired film thickness. This represents a serious challenge to the adoption of ALD or pulsed CVD in real-life manufacturing protocols where process efficiency and productivity are essential.

Although there are no universally accepted descriptions of MLD, SAM, and CCD, these are techniques that, along with ALD, have the potential to enable formation of exceedingly thin film structures with atomic or molecular level control. Common features among these techniques include surface adsorption and the attachment of sequences of atoms, typically organic molecular "fragments." Ordered arrangements of atoms or uniformly repeated configurations of atoms attach to the surface in a self-limiting manner at significantly lower process temperatures compared to traditional techniques. An overview of these processes is provided in Kaloyeros et al. (*Electrochemical Society Interface*, 27 (4), 61-65 (2018)).

The term MLD is predominantly used to describe a process identical to the sequential dual-surface reactions and self-limiting mechanisms that occur in ALD except for the fact that while ALD focuses on ultrathin inorganic layers, MLD is employed for the formation of ultrathin organic molecular layers. Other reports define MLD as an equivalent technique to ALD for the deposition of organic molecular fragments that may contain inorganic constituents, but which does not require the precise ALD atomic coverage, nor the self-limiting characteristics of the deposition process.

Similarly, the most common portrayal of SAM is a process wherein ordered organic molecular assemblies can adsorb and then spontaneously orient on a substrate surface from either the gaseous or liquid phase through intermolecular interactions. SAM may be used as a surface modification template to custom design the formation and growth of the subsequent ultrathin film, which would then be grown by CVD or ALD. One of the main benefits of SAM is its ability to deposit a sole molecule or a single molecular length of essentially an individual monolayer. A SAM molecule typically consists of three sections: an anchor group which attaches to the underlying substrate surface, a molecular chain (e.g., an alkyl group), and a terminal group which may or may not have functionality. The terminal group is important for area specific deposition. Non-functional terminal groups tend to suppress deposition processes while terminal groups with appropriate functionality initiate area selective deposition.

The term "Click Chemistry" was first introduced in 2001 by Nobel Laureate Barry Sharpless. In the context of this disclosure, CCD refers to chemical reactions that occur with sufficient thermodynamic driving force to enable deposition at or near room temperature with very little or no byproducts. CCD has the potential for a single reactant interaction with a substrate surface, producing total or near total atom-specific attachment of an ordered assembly of multiple atoms as a monolayer film. CCD may also involve the reaction of multiple reagents, generating complete or near complete consumption and conversion to a single deposition. The latter would assume the form of an extremely thin or single monolayer on the substrate surface.

One of the attractive features of SAM and CCD is their demonstrated potential to catalyze, enable, or suppress area-specific or area-selective deposition. Specific chemistries (precursors) and surface structures may be made to interact in order to induce or prevent deposition on certain regions of the underlying surface, resulting in the growth of a "near-zero-thickness" layer only on the desirable areas of the substrate. This layer may then act as a seed template for subsequent area-selective ALD (AS-ALD) or CVD (AS-CVD).

MLD, like ALD, represents a process in which single monolayers are deposited and then, by iterative growth cycles, can build thicker structures, whereas SAM and CCD tend to be exclusively "single monolayer" type growth processes and, as such, their practical usefulness is limited to niche applications. Conversely, MLD suffers from the same challenges associated with ALD, particularly, very low growth rates and very long deposition times.

For these reasons, it is desirable to provide thin film deposition procedures that overcome the drawbacks discussed above for these various deposition techniques by inventing hybrid growth processes or integrated physical-chemical deposition processes that combine and unite the advantages of physical (i.e., sputtering) and chemical (i.e., CVD, ALD, MLD, SAM, and/or Click) deposition processes, while minimizing or eliminating their individual shortcomings and challenges. In a physical reaction, such as evaporation or sputtering, a thin film is formed by physical vapor transport of its constituent from one solid state phase to a vapor phase and back to a solid state by condensing on a substrate. Conversely, in a chemical reaction, such as in CVD, ALD, MLD, SAM, and/or Click, two or more reactants, precursors, or molecular entities undergo a chemical reaction either in the gas (vapor) phase or on the substrate surface and are subsequently transformed into a thin film with different properties from its parent reactants. As discussed earlier, it is highly desirable to invent a novel combined physical and chemical method (physico-chemical) methodology that produces thin films through the combination of physical and chemical reactions.

SUMMARY OF THE INVENTION

Aspects of the disclosure relate to a physico-chemical method for depositing a conformal layer on a substrate, comprising:
  providing a substrate in a reactor;
  providing a sputtering target in the reactor;
  introducing a chemical species into the reactor in the vapor phase above the substrate and/or on a substrate surface;
  ejecting single atoms or multi-atom clusters comprising up to three atoms from the sputtering target;
  causing the ejected single atoms or multi-atom clusters to interact with the chemical species in the vapor phase above the substrate and/or on the substrate surface;
  wherein the interaction forms a complex in the vapor phase and/or on the substrate surface;
  wherein the complex has a reduced sticking coefficient and higher surface mobility than the ejected atoms or clusters; and
  forming a conformal layer from the complex on the substrate surface, wherein the conformal layer has the same elemental composition as the sputtering target.

Another embodiment according to aspects of the disclosure is directed to a physico-chemical method for depositing a conformal layer on a patterned substrate, the method comprising:
  providing a patterned substrate in a reaction zone of a deposition chamber;
  providing a sputtering target in the reaction zone of the deposition chamber;
  heating the substrate to a temperature of about 100° C. to about 650° C.;
  maintaining the substrate at about 100° C. to about 650° C.,
  performing a chemically reactive vapor deposition step comprising treating the patterned substrate with a single chemically reactive vapor deposition cycle by exposing the patterned substrate to a pulse of a precursor that physisorbs or chemisorbs on a surface of the patterned substrate to form a conformal catalytic or reactive monolayer or near-zero-thickness layer on the substrate surface;
  forming a plasma of an inert or reactive gas between the sputtering target and the substrate;
  performing a sputtering step by using the plasma to sputter a single element or a binary compound from the sputtering target onto the monolayer or near-zero-thickness layer on the substrate;
  reacting the sputtered single element or binary compound with the catalytic or reactive monolayer or near-zero-thickness layer on the substrate surface to form a metastable complex; wherein the metastable complex has a reduced sticking coefficient or higher mobility on the substrate surface than the sputtered single element or binary compound; and
  performing a surface-induced process to convert the metastable complex to a conformal layer on the patterned substrate.

In further embodiments, aspects of the disclosure are directed to a physico-chemical method for depositing a conformal layer on a patterned substrate, the method comprising:
  providing a patterned substrate in a reaction zone of a deposition chamber;
  providing a sputtering target in the reaction zone of the deposition chamber;
  heating the substrate to a temperature of about 100° C. to about 650° C.;
  maintaining the substrate at about 100° C. to about 650° C.,
  introducing a reactive or catalytic precursor, reagent, or reactant in a vapor phase into the reaction zone of the deposition chamber;
  forming a plasma of an inert or reactive gas between the sputtering target and the substrate;
  performing a sputtering step by using the plasma to sputter a unary or a binary compound from the sputtering target which reacts with the precursor, reagent, or reactant in the vapor phase to form at least one metastable complex;
  delivering the at least one metastable complex to a substrate surface where the at least one metastable complex physisorbs or chemisorbs with a reduced sticking coefficient or higher mobility than the sputtered unary or binary compound; and
  performing a surface-induced process to convert the at least one metastable complex to a conformal layer on the substrate,
  wherein when the sputtering target comprises a single element, the conformal layer comprises a unary or binary compound, and when the sputtering target comprises a binary element, the conformal layer comprises a binary or ternary compound.

In other embodiments, aspects of the disclosure relate to a physico-chemical method for depositing a conformal compound on a patterned substrate, the method comprising:
  providing a patterned substrate in a reaction zone of a deposition chamber, the patterned substrate comprising at least one region having a first chemical composition and at least one region having a second chemical composition;
  providing a sputtering target in the reaction zone of the deposition chamber;
  heating the substrate to a temperature of about 100° C. to about 650° C.;
  maintaining the substrate at about 100° C. to about 650° C.,
  introducing and reacting molecular structures or precursors on a surface of the substrate to selectively form a reactive or catalytic monolayer, near-zero-thickness layer, or seed layer on the patterned substrate overlaying only the region having the first chemical composition;
  forming a plasma of an inert or reactive gas between the sputtering target and the substrate;

performing a sputtering step by using the plasma to sputter a unary, single element, or binary compound from the sputtering target on the patterned substrate;

wherein the sputtered element or compound reacts with the reactive or catalytic monolayer, near-zero thickness layer, or seed layer to convert through a surface-induced process and selectively forms a conformal binary or ternary compound overlaying only the region having the first chemical composition; and wherein the conformal sputtered element or compound deposits only on the region having the second chemical composition.

Advantageous refinements of the invention, which can be implemented alone or in combination, are specified in the dependent claims.

In summary, the following embodiments are proposed as particularly preferred in the scope of the present invention:

Embodiment 1: a physico-chemical method for depositing a conformal layer on a substrate, comprising:
  providing a substrate in a reactor;
  providing a sputtering target in the reactor;
  introducing a chemical species into the reactor in the vapor phase above the substrate and/or on a substrate surface;
  ejecting single atoms or multi-atom clusters comprising up to three atoms from the sputtering target;
  causing the ejected single atoms or multi-atom clusters to interact with the chemical species in the vapor phase above the substrate and/or on the substrate surface;
  wherein the interaction forms a complex in the vapor phase and/or on the substrate surface;
  wherein the complex has a reduced sticking coefficient and higher surface mobility than the ejected atoms or clusters; and
  forming a conformal layer from the complex on the substrate surface, wherein the conformal layer has the same elemental composition as the sputtering target.

Embodiment 2: A physico-chemical method for depositing a conformal layer on a patterned substrate, the method comprising:
  providing a patterned substrate in a reaction zone of a deposition chamber;
  providing a sputtering target in the reaction zone of the deposition chamber;
  heating the substrate to a temperature of about 100° C. to about 650° C.;
  maintaining the substrate at about 100° C. to about 650° C.,
  performing a chemically reactive vapor deposition step comprising treating the patterned substrate with a single chemically reactive vapor deposition cycle by exposing the patterned substrate to a pulse of a precursor that physisorbs or chemisorbs on a surface of the patterned substrate to form a conformal catalytic or reactive monolayer or near-zero-thickness layer on the substrate surface;
  forming a plasma of an inert or reactive gas between the sputtering target and the substrate;
  performing a sputtering step by using the plasma to sputter a single element or a binary compound from the sputtering target onto the monolayer or near-zero-thickness layer on the substrate;
  reacting the sputtered single element or binary compound with the catalytic or reactive monolayer or near-zero-thickness layer on the substrate surface to form a metastable complex;
  wherein the metastable complex has a reduced sticking coefficient or higher mobility on the substrate surface than the sputtered single element or binary compound; and
  performing a surface-induced process to convert the metastable complex to a conformal layer on the patterned substrate.

Embodiment 3: The method according to Embodiment 2, wherein the chemically reactive vapor deposition and sputtering steps are repeated sequentially, simultaneously, or alternately until a conformal thin film of a predetermined thickness is achieved.

Embodiment 4: The method according to Embodiment 2, wherein the surface-induced process is selected from energy transfer from the substrate, a remote or direct plasma application, electron ionization, oxidation, and/or reduction.

Embodiment 5: The method according to Embodiment 2, further comprising exposing the substrate to a pulse of an inert or reactive gas prior to forming the plasma to remove reaction byproducts from the deposition chamber.

Embodiment 6: The method according to Embodiment 5, wherein the inert gas is selected from the group consisting of neon, argon, xenon, and krypton.

Embodiment 7: The method according to Embodiment 5, wherein the reactive gas is selected from the group consisting of nitrogen, hydrogen, carbon monoxide, carbon dioxide, ammonia, hydrazine, and hydrogen azide.

Embodiment 8: The method according to Embodiment 2, wherein the substrate is selected from the group consisting of silicon, silicon dioxide, silicon nitride, silicon carbide, silicon-germanium alloys, germanium, gallium, gallium nitride, cobalt, ruthenium, platinum, silver, platinum, gold, nickel, copper, platinum, titanium, alumina (sapphire), aluminum, aluminum nitride, titanium nitride, titanium carbide, tantalum, and tantalum nitride.

Embodiment 9: The method according to Embodiment 2, wherein a working pressure in the reactor during the vapor deposition step ranges from about 0.0001 torr to about 760 torr.

Embodiment 10: The method according to Embodiment 2, wherein the chemically reactive vapor deposition step consists of one or more of ALD, ALCVD, CVD, MLD, SAM, or CLICK.

Embodiment 11: A physico-chemical method for depositing a conformal layer on a patterned substrate, the method comprising:
  providing a patterned substrate in a reaction zone of a deposition chamber;
  providing a sputtering target in the reaction zone of the deposition chamber;
  heating the substrate to a temperature of about 100° C. to about 650° C.;
  maintaining the substrate at about 100° C. to about 650° C.,
  introducing a reactive or catalytic precursor, reagent, or reactant in a vapor phase into the reaction zone of the deposition chamber;
  forming a plasma of an inert or reactive gas between the sputtering target and the substrate;
  performing a sputtering step by using the plasma to sputter a unary or a binary compound from the sputtering target which reacts with the precursor, reagent, or reactant in the vapor phase to form at least one metastable complex;
  delivering the at least one metastable complex to a substrate surface where the at least one metastable complex physisorbs or chemisorbs with a reduced sticking coefficient or higher mobility than the sputtered unary or binary compound; and performing a surface-induced process to convert the at least one metastable complex to a conformal layer on the substrate, wherein when the sputtering target comprises a single element, the conformal layer comprises a unary or binary compound, and when the sputtering target comprises a binary element, the conformal layer comprises a binary or ternary compound.

Embodiment 12: The method according to Embodiment 11, wherein the sputtering step and the surface induced process are performed concurrently until the conformal layer on the substrate reaches a desired thickness on the substrate.

Embodiment 13: The method according to Embodiment 11, wherein the precursor is a fully coordinated chemical compound, a non-fully coordinated compound, a molecular fragment, or an ionic species.

Embodiment 14: A physico-chemical method for depositing a conformal compound on a patterned substrate, the method comprising:

providing a patterned substrate in a reaction zone of a deposition chamber, the patterned substrate comprising at least one region having a first chemical composition and at least one region having a second chemical composition;

providing a sputtering target in the reaction zone of the deposition chamber;

heating the substrate to a temperature of about 100° C. to about 650° C.;

maintaining the substrate at about 100° C. to about 650° C., introducing and reacting molecular structures or precursors on a surface of the substrate to selectively form a reactive or catalytic monolayer, near-zero-thickness layer, or seed layer on the patterned substrate overlaying only the region having the first chemical composition;

forming a plasma of an inert or reactive gas between the sputtering target and the substrate;

performing a sputtering step by using the plasma to sputter a unary, single element, or binary compound from the sputtering target on the patterned substrate;

wherein the sputtered element or compound reacts with the reactive or catalytic monolayer, near-zero thickness layer, or seed layer to convert through a surface-induced process and selectively forms a conformal binary or ternary compound overlaying only the region having the first chemical composition; and wherein the conformal sputtered element or compound deposits only on the region having the second chemical composition.

Embodiment 15: The method according to Embodiment 14, wherein the sputtering step is repeated until both the binary or ternary compound and the sputtered element or compound reach a desired thickness.

Embodiment 16: The method according to Embodiment 14, wherein the molecular structures or precursors are introduced and reacted using ALD, CVD, ALCVD, MLD, SAM, and/or CLICK.

BRIEF DESCRIPTION OF THE SEVERAL VIEWS OF THE DRAWINGS

The foregoing summary, as well as the following detailed description of the invention, will be better understood when read in conjunction with the appended drawings. For the purpose of illustrating the invention, there are shown in the drawings embodiments which are presently preferred. It should be understood, however, that the invention is not limited to the precise arrangements and instrumentalities shown. In the drawings.

DETAILED DESCRIPTION OF THE INVENTION

Figure 1:
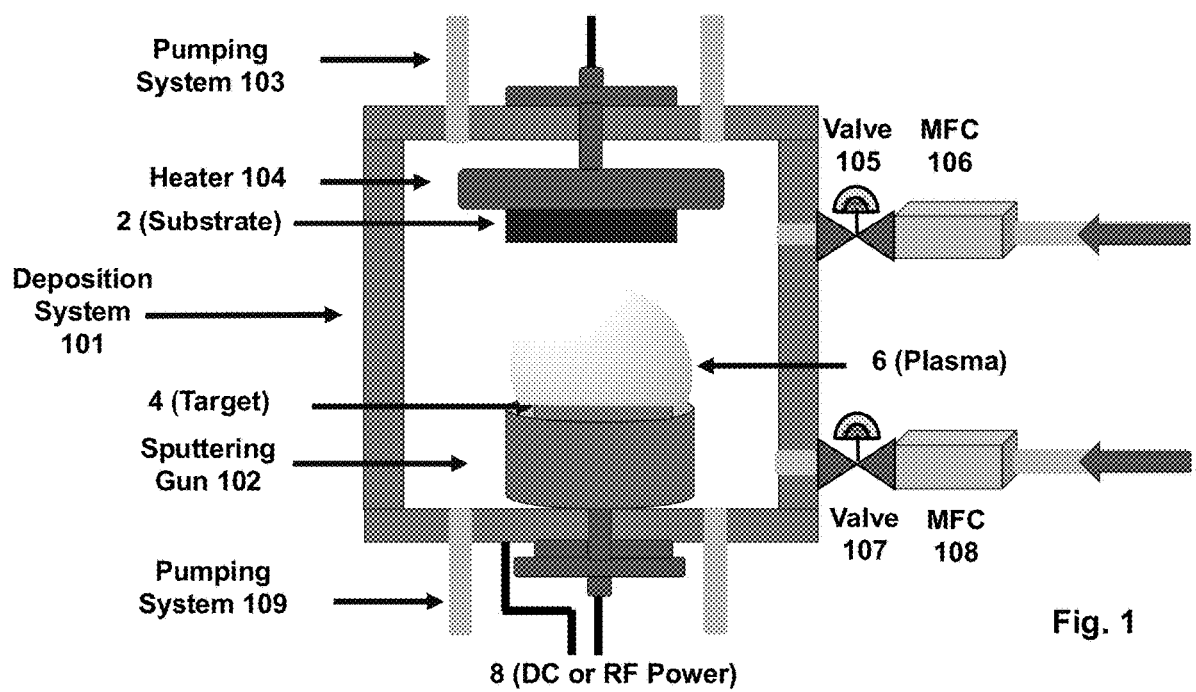
FIG. 1 is a schematic of a combined sputtering/CVD deposition system in accordance with one embodiment of the disclosure.

It is an object of this disclosure to overcome the individual limitations of physical and chemical vapor deposition methodologies and to provide a combined physical and chemical (physico-chemical) method and processing platform that employs both chemical and physical reactions simultaneously or sequentially to grow high quality conformal thin films or layers with systematically variable composition and controlled properties for critical applications in various industries, including the semiconductor, energy, optical, and optoelectronic industries. The advantages of this integrated physical and chemical processing protocol include minimizing the number and complexity of current processing steps employed in manufacturing, while maximizing process safety, efficiency, and productivity. It would also extend and expand the use of industrial physical vapor deposition-based manufacturing infrastructure, which leads to significant cost savings and maximizes returns on existing equipment investments.

The general description provided below showcases the benefits and highlights the commonality, interrelation, and cohesion among the various potential applications of the integrated and unified processing platform that employs both chemical and physical reactions simultaneously or sequentially to grow high quality thin films with programmable composition and controlled properties. As such, all the embodiments below represent various combinations and associated variations of the same underlying innovative concept of assimilating and blending physical and chemical deposition methodologies to exploit and maximize their advantages while simultaneously minimizing or eliminating their shortcomings. As such, the various embodiments presented herein are based on the same driving principle of a new physico-chemical thin film deposition process. These embodiments all share the common traits and exhibit the same underlying reaction mechanisms of the integrated physical-chemical deposition process of this disclosure.

More specifically, all of the combined physico-chemical deposition processes described in the present disclosure share the same innovative concept: forming reactive or catalytic species, molecules, molecular groups, or complexing chemical species or agents, either in the gas (vapor) phase between the sputtering target and the substrate or on the substrate surface. These species are designed to react with sputtered ions, atoms, or molecules to form metastable complexes with reduced sticking coefficient or higher mobility on the substrate surface than the sputtered ions, atoms, or molecules; the metastable complexes then decompose through surface-induced processes to form conformal thin films. The term "metastable complex" may be understood to refer to a molecular species which is sufficiently long-lived as to be stable under the experimental physico-chemical deposition conditions, including the duration of its transport in the gas or vapor phase to the substrate or when formed on a substrate, but is unstable under equilibrium conditions. As such, a metastable complex may exist in a non-equilibrium environment imposed by the physico-chemical reaction environment, but is not stable on a substrate at standard temperature and pressure (STP) conditions.

The surface-induced processes which may be employed include, without limitation, energy transfer (thermal exposure or exchange) from the substrate; remote or direct plasma application with plasma power densities (ranging from about 0.1 W/cm$^2$ to about 1000 W/cm$^2$, and preferably from about 0.5 W/cm$^2$ to about 100 W/cm$^2$, and more preferably from about 1 W/cm$^2$ to about 50 W/cm$^2$); electron ionization at energy levels of about 1 eV or greater (preferably between about 2 eV and about 20 eV), oxidation, and/or reduction. These surface induced processes initiate formation and/or facilitate migration and conversion (decomposition) of the metastable complexes or species to the final deposited film.

Unless otherwise stated, any numerical value is to be understood as being modified in all instances by the term "about." Thus, a numerical value typically includes ±10% of the recited value. For example, the recitation of a temperature such as "10° C." or "about 10° C." includes 9° C. and 11° C. and all temperatures there between.

All numerical ranges expressed in this disclosure expressly encompass all possible subranges, all individual numerical values within that range, including integers within such ranges and fractions and decimal amounts of the values unless the context clearly indicates otherwise.

The term "physical vapor deposition" (PVD) may be understood to refer to and encompass any vapor deposition technique that does not involve a chemical reaction. These include, for example and without limitation, molecular beam epitaxy (MBE), cathodic arc deposition, electron-beam (e-beam) evaporation, thermal evaporative deposition, close-space sublimation, pulsed laser deposition, thermal layer epitaxy, pulsed electron deposition, sublimation sandwich methodology, and sputtering in its various forms.

The term "thin film" is well understood in the art and may include films ranging in thickness from a few nanometers to a few microns. More specifically, the term "thin film" may be understood to refer to a film having a thickness of less than about 5,000 nm and preferably between about 100 nm and about 500 nm and more preferably between about 25 nm and about 50 nm. For the purposes of this disclosure, the terms "layer" and "thin film" are synonymous.

The term "patterned substrate" is well understood in the art to signify a substrate in which via, channel, and trench structures have been formed through etching and/or other processes that are known in the art. It is further understood that a "patterned substrate" may consist of regions or areas of different elemental or chemical compositions, such as a substrate having discrete metallic and non-metallic regions, a substrate having discrete hydrogenated and non-hydrogenated layers on conducting and semi-conducting regions, and/or a substrate having discrete conductor and insulator regions having surfaces without hydroxyl groups and with hydroxyl groups, respectively. Such substrates are typically used to form integrated circuitry (IC) devices and interconnects.

The term "conformal" or "uniform" deposition or thickness is well understood in the art to signify that the ratio of film thickness at the bottom and side walls of substrate topographies (vias and trenches) to the film thickness in the substrate field outside the substrate topographies is higher than about 50%, and preferably higher than about 80%, and more preferably higher than about 90%. Similarly, "conformal coverage" is meant to signify that a film of uniform thickness precisely follows the geometry/topographies of the underlying substrate with film thickness fluctuations not exceeding about 50% of the average film thickness, and preferably not exceeding about 20% of the average film thickness, and more preferably about 10% of the average film thickness.

The term "near zero thickness" is well understood in the art to signify films or layers of thickness below about 25 nm and more preferably a thickness below about 10 nm.

The term "monolayer" is well understood in the art to signify films or layers of thickness below about 10 nm and more preferably a thickness below about 5 nm.

The term "sputtering distance" is well understood in the art to signify the distance separating a sputtering target and a substrate. The distance typically ranges from about 1 cm to about 50 cm, and more preferably from about 5 cm to about 15 cm.

The term "unary compound" is meant to signify in the context of the present disclosure a compound consisting of a single element.

The term "above the sputtering target" is meant to refer to the distance separating the sputtering target and the substrate.

The term "sputtered species" is meant to refer to and encompass sputtered species consisting of single atoms or ions or multi-atomic or multi-ionic clusters, i.e., atomic or ionic groups containing three or less atoms of the same atomic element or up to three different atomic elements.

The term "chemically reactive vapor deposition" process is meant to refer to and encompass any vapor deposition technique that involves a chemical reaction. These include, for example and without limitation, ALD, ALCVD, CVD, MLD, SAM, and Click in their various forms.

The terms "chamber," "reaction chamber," "deposition chamber," "deposition system," "reactor", and "processing system" are all understood to mean in the context of this disclosure a sputtering system equipped with CVD, ALD, ALCVD, MLD and/or Click features and capabilities, such as, for example and without limitation, a precursor reservoir or bubbler, a precursor delivery system, an ALD valving manifold with high speed actuation, and the like; or a CVD, ALD, ALCVD, MLD and/or Click system equipped with sputtering features and capabilities, such as sputtering guns and DC or RF plasma forming power supplies and the like. Sputtering target placement into the chamber may further be understood to mean placing the target into a sputter gun attached to the deposition system.

The term "inert gas" is understood to mean in the context of this disclosure a non-reactive gas such as neon, argon, xenon, and krypton.

The term "reactive gas" is understood to mean in the context of this disclosure a gas such as nitrogen, hydrogen, carbon monoxide, carbon dioxide, ammonia, hydrazine, and hydrogen azide.

The term "surface-induced processes" is understood to include, in the context of this disclosure, energy transfer (thermal exposure or exchange) from the substrate; remote or direct plasma application with plasma power densities (ranging from about 0.1 W/cm$^2$ to about 1000 W/cm$^2$, and more preferably from about 1 W/cm$^2$ to about 50 W/cm$^2$); electron ionization at energy levels of about 1 eV or greater (preferably between about 2 eV and about 20 eV), oxidation, and/or reduction, which initiates formation and/or facilitates migration and conversion (decomposition) of the metastable complexes or species to the final deposited film.

The terms CVD precursor, ALCVD precursor, ALD precursor, MLD precursor, SAM precursor, Click precursor (collectively referred to as "precursors"), and complexing chemical species or agent are well understood in the art to refer to a reactive or catalytic gaseous reactant or volatile liquid reactant that is formed or made of ligands, molecular groups, molecular clusters, and/or molecular and atomic structures that may contain one or more of the elements that are desired in a thin film. The precursor may either be a fully coordinated chemical compound, a non-fully coordinated compound, or a molecular fragment or ionic species.

Examples of precursors within the scope of the disclosure include chemical compounds with double bonds or unsaturation, including olefins, preferably diolefins such as butadiene, cyclooctadiene, vinylnorbornene, cyclopentadiene, nitrogen monoxide, carbon monoxide, hydrazine, dimethylhydrazine, hydrazoic acid, and amines, preferably tertiary amines, such trimethylamine, tetramethylethylenediamine, as well as other coordinative compounds such as diketonates and tertiary phosphines.

In the context of the present disclosure, the precursor or complexing chemical species or agent is designed to react with sputtered ions, atoms, or molecules to form metastable complexes with reduced sticking coefficient or higher mobility on the substrate surface, which then decompose through surface-induced processes to form conformal thin films. The precursor or complexing chemical species or agent is therefore engineered to ensure that the resulting metastable complexes and associated surface-induced processes yield a sticking coefficient S and probability of desorption $P_d$ that are limited to the range from about 0.01 to about 0.9 and more preferably from about 0.1 to about 0.5 each. Alternatively, the precursor is designed to ensure that the resulting metastable complexes and associated surface-induced processes enhance or maximize $(P_a+P_m)$, with values typically in the range from about 0.01 to about 1.0 and more preferably from about 0.1 to about 0.75.

Methods for measuring the sticking coefficient are well established and understood in the art, as further set forth below. Surface mobility is determined indirectly by comparing the conformality of the deposited films under different experimental conditions and deriving a qualitative or empirical relative mobility for different deposition conditions. The higher the conformality value, the higher the mobility. See, for example, K. D. Gibson et al. ("Determination of the sticking coefficient and scattering dynamics of water on ice using molecular beam techniques," *The Journal of Chemical Physics* 134, 034703 (2011)); M. Ortino ("Sticking Coefficients for Technical Materials in Vacuum Technology," Masters Thesis, Politecnico di Milano (2016)); C.-H Xia et al. ("Evaluating atomic mobility and interdiffusivity based on two-dimensional diffusion simulations and diffusion triple experiments," *Scripta Materilia* 188, 124 (2020)), and W. Chen et al. ("Atomic mobilities, diffusion coefficients, and kinetic coefficients in Ti-rich Ti—Mo—Nb system," Calphad, 84, 102654 (2024)).

While not wishing to be bound by theory, it is worth noting that the "sticking coefficient" S is defined as the ratio of the number of adsorbate atoms or molecules that impinge and adsorb, or "stick", to the substrate surface relative to the total number of atoms, ions, or molecules that impinge upon that surface during the same period of time. It is defined as:

$$S=R/J_P$$

R is the rate of adsorption (i.e., the number of molecules adsorbing on a solid surface per second), and $J_P$ is the pressure-dependent frequency or flux with which the entire surface experiences collisions from the gas (vapor) phase. The frequency or flux is given by the Hertz-Knudsen equation:

$$J_P=P/(2\pi mkT)^{1/2}$$

P is the gas pressure; m is the mass of one atom, ion, or molecule; k is the Boltzmann constant, and T is the substrate temperature.

When impinging on a substrate surface, an ion, atom, molecule, or cluster of atoms or ions has 3 probabilities: (i) $P_a$, which represents the probability of adsorbing to the surface; (ii) $P_m$, which represents the probability of migration to another substrate surface site; and (iii) $P_d$, which represents the probability of desorption from the substrate surface and return to the gaseous phase, with the sum of these three probabilities equal to one:

$$P_a+P_m+P_d=1$$

All three probabilities are highly dependent on the chemistry and reactivity of the adsorbate species and the substrate surface, including the presence of activation barriers to adsorption and migration. It has been discovered that $(P_a+P_m)$ can be maximized while concurrently reducing or minimizing both S and $P_d$, by forming reactive or catalytic species, molecules, or molecular groups either in the gas or vapor phase between the sputtering target and the substrate or on the substrate surface that are designed to react with the sputtered ions, atoms, or molecules to form metastable complexes with reduced sticking coefficient or higher mobility on the substrate surface, which would then decompose through surface-induced processes to form conformal thin films. The methods described in the present disclosure ensure that the metastable complexes and associated surface-induced processes are designed to limit the sticking coefficient S and probability of desorption $P_d$ to the range from about 0.01 to about 0.9 and more preferably from about 0.1 to about 0.5 each, which are therefore significantly lower than those for sputtered ions, atoms, and molecular clusters. Similarly, the metastable complexes and associated surface-induced processes have been designed to enhance or maximize $(P_a+P_m)$, with values typically in the range from about 0.01 to about 1.0 and more preferably from about 0.1 to about 0.75, which are therefore significantly higher than those for sputtered ions, atoms, and molecular clusters.

The term "area selective deposition" is understood in the art to mean that deposition occurs selectively only on specific pre-determined locations on the patterned substrate with no deposition occurring on the remaining areas of the substrate. Additive-type surface-induced processes are understood in the context of this disclosure to mean that deposition occurs only the areas of the substrate where the reactive or catalytic monolayers are located. Substrative-type surface-induced processes are understood in the context of this disclosure to mean that deposition occurs only the areas of the substrate where the reactive or catalytic monolayers are absent, i.e., the reactive or catalytic monolayers act to inhibit or prevent deposition in the regions where they are located.

The phrase "as-deposited" is understood in the art to mean that the film has the properties of utility immediately after deposition without further treatment such as plasma processes, irradiation, high-temperature reflow inside asperities, cavities, vias, channels, and recesses in the substrate, or thermal annealing.

The processes described herein may be used to produce conformal and pure metal, semiconductor, and insulating films such as, for example and without limitation, nickel, platinum, tungsten, cobalt, aluminum, platinum, silver, gold, tantalum, titanium, ruthenium, gallium, alumina, and silicon as well as their carbides, nitrides, and oxides where applicable.

Appropriate substrates include the preferred silicon, as well as, for example and without limitation, silicon dioxide, silicon nitride, silicon carbide, silicon-germanium alloys, low dielectric constant materials, germanium, gallium, gallium nitride, cobalt, ruthenium, platinum, silver, platinum, gold, nickel, copper, platinum, titanium, alumina (sapphire), aluminum, aluminum nitride, titanium nitride, titanium carbide, tantalum, and tantalum nitride. Appropriate patterned substrates may consist of regions or areas of different elemental or chemical compositions, such as a substrate having discrete metallic (copper, ruthenium, cobalt, silver, gold, etc.) and non-metallic regions (silicon, silicon nitride, silicon oxide, low dielectric constant materials, etc.).

The embodiments disclosed herein are not intended to be limiting. In one embodiment, the disclosure relates to a physico-chemical method for depositing a conformal layer on a substrate, as well as a system comprising a combined sputtering/ALD deposition system. The method comprises: providing a substrate in a reactor; providing a sputtering target in the reactor; introducing a chemical species into the reactor in the vapor phase above the substrate and/or on a substrate surface; ejecting single atoms or multi-atom clusters comprising up to three atoms from the sputtering target; causing the ejected single atoms or multi-atom clusters to interact with the chemical species in the vapor phase above the substrate and/or on the substrate surface; wherein the interaction forms a complex in the vapor phase and/or on the substrate surface; wherein the complex has a reduced sticking coefficient and higher surface mobility than the ejected atoms or clusters; and forming a conformal layer from the complex on the substrate surface, wherein the conformal layer has the same elemental composition as the sputtering target.

These steps will be described in more detail below.

In one embodiment, aspects of the disclosure relate to a physico-chemical method for depositing a conformal layer on a patterned substrate. The method comprises:

providing a patterned substrate in a reaction zone of a deposition chamber;

providing a sputtering target in the reaction zone of the deposition chamber;

heating the substrate to a temperature of about 100° C. to about 650° C.;

maintaining the substrate at about 100° C. to about 650° C., performing a chemically reactive vapor deposition step comprising treating the patterned substrate with a single chemically reactive vapor deposition cycle by exposing the patterned substrate to a pulse of a precursor that physisorbs or chemisorbs on a surface of the patterned substrate to form a conformal catalytic or reactive monolayer or near-zero-thickness layer on the substrate surface;

forming a plasma of an inert or reactive gas between the sputtering target and the substrate;

performing a sputtering step by using the plasma to sputter a single element or a binary compound from the sputtering target onto the monolayer or near-zero-thickness layer on the substrate;

reacting the sputtered single element or binary compound with the catalytic or reactive monolayer or near-zero-thickness layer on the substrate surface to form a metastable complex; wherein the metastable complex has a reduced sticking coefficient or higher mobility on the substrate surface than the sputtered single element or binary compound; and performing a surface-induced process to convert the metastable complex to a conformal layer on the patterned substrate.

Appropriate substrates have been previously described and may include, for example, and without limitation, substrates consisting of silicon, silicon dioxide, silicon nitride, silicon carbide, silicon-germanium alloys, low dielectric constant materials, germanium, gallium, gallium nitride, cobalt, ruthenium, platinum, silver, gold, nickel, copper, titanium, alumina (sapphire), aluminum, aluminum nitride, titanium nitride, titanium carbide, tantalum, and tantalum nitride.

Appropriate sputtering targets may include, for example, single element targets such as silicon, germanium, gallium, cobalt, ruthenium, chromium, platinum, silver, platinum, gold, nickel, copper, platinum, titanium, aluminum, and tantalum; as well dual element or compound targets such as silicon dioxide, silicon nitride, silicon carbide, silicon-germanium alloys, alumina (sapphire), aluminum nitride, titanium nitride, titanium carbide, tantalum nitride, silicon-titanium, silicon-tantalum, etc.

In the heating step, the temperature of the substrate is heated to about 100° C. to about 650° C., more preferably about 250° C. to about 450° C., including all intervening temperatures, such as about 255° C., 260° C., 265° C., 270° C., 275° C., 280° C., 285° C., 290° C., 295° C., 300° C., 305° C., 310° C., 315° C., 320° C., 325° C., 330° C., 335° C., 340° C., 345° C., 350° C., 355° C., 360° C., 365° C., 370° C., 375° C., 380° C., 385° C., 390° C., 395° C., 400° C., 405° C., 410° C., 415° C., 420° C., 425° C., 430° C., 435° C., 440° C., and about 445° C.

The first active step of the method involves performing a chemically reactive vapor deposition step comprising treating the patterned substrate with a single chemically reactive vapor deposition cycle by exposing the patterned substrate to a pulse of a precursor that physisorbs or chemisorbs on a surface of the patterned substrate to form a conformal catalytic or reactive monolayer or near-zero-thickness layer on the substrate surface.

The chemically reactive vapor deposition step may involve an ALD surface treatment and exposing the substrate to a pulse of an ALD precursor followed by exposing the substrate to a pulse of an inert or reactive gas to remove reaction byproducts from the system; the layer which forms on the substrate surface has uniform step coverage in substrate patterned structures and topographies. However, as explained below, the chemically reactive deposition step is not limited to ALD.

In preferred embodiments, the working pressure in the reactor during the vapor deposition step ranges from about 0.0001 torr to about 760 torr.

The next active step involves forming a plasma of an inert or reactive gas between the sputtering target and the substrate. For example, the inert gas may be selected from the group consisting of neon, argon, xenon, and krypton, and the reactive gas may be selected from the group consisting of nitrogen, hydrogen, carbon monoxide, carbon dioxide, ammonia, hydrazine, and hydrogen azide.

Subsequently, the method involves performing a sputtering step by using the plasma to sputter a single element or a binary compound from the sputtering target onto the monolayer or near-zero-thickness layer on the substrate, and then reacting the sputtered single element or binary compound with the catalytic or reactive monolayer or near-zerothickness layer on the substrate surface to form a metastable complex. The metastable complex has a reduced sticking coefficient or higher mobility on the substrate surface than the sputtered single element or binary compound.

Finally, the method involves performing a surface-induced process to convert the metastable complex to a conformal layer on the patterned substrate. The surface-induced process may be energy transfer from the substrate, a remote or direct plasma application, electron ionization, oxidation, and/or reduction.

In this method, the ALD (or other chemically reactive vapor deposition process)—formed monolayer acts as seed or template for enabling conformal deposition of the sputtered element or binary compound onto the patterned substrate. The chemically reactive vapor deposition and sputtering steps are repeated sequentially, simultaneously, or alternately until the deposited film or layer reaches a pre-determined thickness on the substrate. The term "sequentially" may be understood that each step is performed multiple times, whereas "alternately" means that each step is performed once. As previously explained, the chemically reactive vapor deposition step may involve, instead of or in addition to ALD, ALCVD, MLD, SAM, and/or Click deposition step(s). In some embodiments, the method may involve exposing the substrate to a pulse of an inert or reactive gas prior to forming the plasma to remove reaction byproducts from the deposition chamber.

In another embodiment, this disclosure relates to a physico-chemical method for depositing a conformal layer (which may be binary or ternary) on a patterned substrate. The method comprises: providing a patterned substrate in a reaction zone of a deposition chamber; providing a sputtering target in the reaction zone of the deposition chamber; heating the substrate to a temperature of about 100° C. to about 650° C.; maintaining the substrate at about 100° C. to about 650° C., introducing a reactive or catalytic precursor, reagent, or reactant in a vapor phase into the reaction zone of the deposition chamber; forming a plasma of an inert or reactive gas between the sputtering target and the substrate; performing a sputtering step by using the plasma to sputter a unary or a binary compound from the sputtering target which reacts with the precursor, reagent, or reactant in the vapor phase to form at least one metastable complex; delivering the at least one metastable complex to a substrate surface where the at least one metastable complex physisorbs or chemisorbs with a reduced sticking coefficient or higher mobility than the sputtered unary or binary compound; and performing a surface-induced process to convert the at least one metastable complex to a conformal layer on the substrate. When the sputtering target comprises a single element, the conformal layer comprises a unary or binary compound, and when the sputtering target comprises a binary element, the conformal layer comprises a binary or ternary compound. Several of these steps have been described previously.

One step of this method involves introducing a reactive or catalytic precursor, reagent, or reactant in a vapor phase into the reaction zone of the deposition chamber. The precursor, reagent, or reactant may be a fully coordinated chemical compound, a non-fully coordinated chemical compound, a molecular fragment, or an ionic species, and may be introduced with or without a co-reactant.

In this method, the sputtering step involves using the plasma to sputter a unary or a binary compound from the sputtering target which reacts with the precursor, reagent, or reactant in the vapor phase to form at least one metastable complex, which is then followed by a step of delivering the at least one metastable complex to a substrate surface where the at least one metastable complex physisorbs or chemisorbs with a reduced sticking coefficient or higher mobility than the sputtered unary or binary compound.

Finally, the method involves performing a surface-induced process as previously described to convert the at least one metastable complex to a conformal layer on the substrate. When the sputtering target comprises a single element, the conformal layer comprises a unary or binary compound, and when the sputtering target comprises a binary element, the conformal layer comprises a binary or ternary compound.

The sputtering step and the surface induced process are performed concurrently until the conformal layer on the substrate reaches a desired or pre-determined thickness on the substrate.

In this method, the step of introducing the reactive or catalytic precursor, reagent, or reactant in a vapor phase into the reaction zone of the deposition chamber may be performed using an ALD, MLD, SAM, or Click method.

In an additional embodiment, this disclosure relates to a hybrid, combined, or integrated method and system for depositing a conformal layer (which may be unary, binary, or ternary) on a substrate. The method comprises: providing a substrate in a reaction zone of a deposition chamber; providing a sputtering target in the reaction zone of the deposition chamber at a pre-determined adjustable distance from the substrate; heating the substrate to a temperature of about 100° C. to about 650° C.; maintaining the substrate at about 100° C. to about 650° C., introducing a reactive or catalytic CVD precursor, reagent, or reactant in a vapor phase into the reaction zone of the deposition chamber at an intermediate distance between the substrate and the sputtering target; forming a plasma of an inert or reactive gas between the sputtering target and the substrate; performing a sputtering step by using the plasma to sputter a unary or a binary compound from the sputtering target which reacts with the precursor, reagent, or reactant in the vapor phase to form at least one metastable complex; delivering the at least one metastable complex to a substrate surface where it physisorbs or chemisorbs with a reduced sticking coefficient or higher mobility than the sputtered unary or binary compound; and performing a surface-induced process to convert the at least one metastable complex to a conformal layer on the substrate. When the sputtering target comprises a single element, the conformal layer comprises a unary or binary compound, and when the sputtering target comprises a binary element, the conformal layer comprises a binary or ternary compound. Several of these steps have been described previously.

The plasma formation, sputtering, metastable complex formation, and CVD deposition steps are performed simultaneously and concurrently until the conformal layer on the substrate reaches a desired and predetermined thickness.

The CVD precursor may be either a fully coordinated chemical compound, a non-fully coordinated compound, or a molecular fragment or ionic species. It is also understood that ALD, MLD, SAM, or Click may be substituted for the CVD step and precursor.

In another embodiment, this disclosure relates to a hybrid, shared, combined or integrated physico-chemical method and system for depositing a conformal compound on a patterned substrate. The method comprises: providing a patterned substrate in a reaction zone of a deposition chamber, the patterned substrate comprising at least one region having a first chemical composition and at least one region having a second chemical composition; providing a sputtering target in the reaction zone of the deposition chamber; heating the substrate to a temperature of about 100° C. to about 650° C.; maintaining the substrate at about 100° C. to about 650° C., introducing and reacting molecular structures or precursors on a surface of the substrate to selectively form a reactive or catalytic monolayer, near-zero-thickness layer, or seed layer on the patterned substrate overlaying only the region having the first chemical composition; forming a plasma of an inert or reactive gas between the sputtering target and the substrate; performing a sputtering step by using the plasma to sputter a unary, single element, or binary compound from the sputtering target on the patterned substrate; wherein the sputtered element or compound reacts with the reactive or catalytic monolayer, near-zero thickness layer, or seed layer to convert through a surface-induced process and selectively forms a conformal binary or ternary compound overlaying only the region having the first chemical composition; and wherein the conformal sputtered element or compound deposits only on the region having the second chemical composition.

This process may be or utilize, in preferred embodiments, a combined sputtering/SAM method or reactor or a combined sputtering/Click method or reactor which results in area-selective thin film deposition on a patterned substrate having two different types of regions having different chemical compositions. That is, the binary or ternary compound which is formed overlays only one pre-determined region (regions) of the substrate having a first chemical composition and the sputtered element or compound deposits only on a second predetermined region (or regions) having a second chemical composition.

Many of the method steps have been previously described. One active step of the method involves introducing and reacting molecular structures or precursors on a surface of the substrate to selectively form a reactive or catalytic monolayer, near-zero-thickness layer, or seed layer on the patterned substrate overlaying only the region having the first chemical composition. In this step, the molecular structures or precursors have been pre-designed or specifically-tailored or tightly-engineered to grow the reactive or catalytic monolayer, near-zero-thickness layer, or seed layer only on the appropriate pre-determined locations on the patterned substrate.

The sputtering step in this method involves using the plasma to sputter a unary, single element, or binary compound from the sputtering target on the patterned substrate. The sputtered element or compound reacts with the reactive or catalytic monolayer, near-zero thickness layer, or seed layer to convert through a (preferably additive-type) surface-induced process and selectively forms a binary or ternary compound overlaying only the region having the first chemical composition (where the monolayer is located). The sputtered element or compound deposits only on the region having the second chemical composition (where the monolayer is absent).

The sputtering process is continued (the sputtering step is repeated) until both the binary or ternary compound and the sputtered element or compound reach the desired thicknesses. It is also understood that ALD, CVD, ALCVD, or MLD may be substituted for the SAM or Click step.

Further aspects of the disclosure relate to a hybrid, combined, or integrated physico-chemical method and system for depositing a conformal layer (which may be binary or ternary) on a patterned substrate, which combines sputtering and ALD.

The method comprises: providing a patterned substrate in a reaction zone of a deposition chamber; providing a sputtering target in the reaction zone of the deposition chamber; heating the substrate to a temperature of about 100° C. to about 650° C.; maintaining the substrate at about 100° C. to about 650° C.; subjecting the substrate to an ALD surface treatment by exposing the substrate to a pulse of a precursor that physisorbs or chemisorbs to the substrate surface to form a reactive or catalytic monolayer or near zero thickness layer on the substrate with uniform step coverage in substrate patterned structures and topographies; exposing the substrate to a pulse of an inert or reactive gas to remove reaction byproducts from the system; forming a plasma of an inert or reactive gas between the sputtering target and the substrate; performing a sputtering step by using the plasma to sputter a unary or a binary compound from the sputtering target which reacts with the precursor, reagent, or reactant in the vapor phase to form at least one metastable complex; delivering the at least one metastable complex to a substrate surface where the at least one metastable complex physisorbs or chemisorbs with a reduced sticking coefficient or higher mobility than the sputtered unary or binary compound; and performing a surface-induced process to convert the at least one metastable complex to a conformal layer on the substrate. When the sputtering target comprises a single element, the conformal layer comprises a unary or binary compound, and when the sputtering target comprises a binary element, the conformal layer comprises a binary or ternary compound. These steps have been described previously.

The ALD and sputtering deposition steps are repeated sequentially, simultaneously, or alternatively until the deposited film reaches a pre-determined thickness on the substrate. It is also understood that ALCVD, MLD, CVD, SAM, or Click may be substituted for the ALD step.

In preferred embodiments, in the methods described herein, the energy applied to the sputtering target favors the ejection of sputtered species consisting of single atoms or ions or multi-atomic or multi-ionic clusters (i.e., atomic or ionic groups containing three or less atoms of the same atomic element or up to three different atomic elements) with the ratio of the concentration of complexing chemical species to that of sputtered species being >1:1. Furthermore, the preferred complexing chemical species or agent is capable of p-bond (pi-bond) interaction. Such complexing chemical species include, for example, carbon monoxide, ethylene, acetylene and cyclooctadiene. Additionally, it is preferred that the ratio of complexing chemical species or agent to sputtered species in the metastable complex is lower than that for the ratio for the formation of a stable coordination complex. In the case of tungsten, for example, the ratio of carbon monoxide to sputtered species in the metastable complex is less than 6:1, for example, $W(CO)_x{}^*$ where x ranges from 1 to 5, with $W(CO)_6$ being the stable coordination complex.

Aspects of the disclosure as described herein related to hybrid growth processes or integrated physico-chemical deposition processes that combine and unite the advantageous features and beneficial characteristics of physical (i.e., sputtering) and chemical (i.e., CVD, ALD, MLD, SAM, and/or Click) deposition processes, while minimizing or eliminating their individual shortcomings and challenges.

Sputtering is a "line-of-sight" deposition technique in which there is a linear path or straight forward directionality of atoms, ions, or small atomic clusters from a target and to a substrate. Stated differently, standard sputtering provides material transport in a direct path between two points without the ability to change direction or modulate material delivery. This allows uniform coverage on flat surfaces but does not allow conformality in rough or surface features such as trenches. The atoms, ions, or atomic clusters have a high "binding affinity" or "sticking coefficient" with the substrate. The consequence of the high sticking coefficient is that the impinging atoms, ions or atomic clusters have either no ability or a low probability of migration on the surface of the substrate, disallowing uniform coverage of all substrate features. Sputtering inherently leads to lack of conformality on topographic structures, particularly the sidewalls of vias and trenches in nanoscale features associated with semiconductor, solar, and photonic devices. In other words, all sputtering processes consist of a linear or direct film deposition that does not follow the contours of features, especially those features that can be described as asperities, cavities, vias, channels, or recesses in the substrate.

This disclosure solves this challenge by not only enabling highly active migration of the impinging atoms, ions, or atomic clusters into the trenches and vias, but also by allowing controlled and engineered reactions with all of the topographic features of the substrate surface, thus achieving excellent substrate conformality. This is obtained by introducing molecular species or complexing chemical species or agents in the vapor phase or adsorbed on the substrate surface that enable surface mobility by formation of metastable complexes with the atoms or clusters of atoms or ions generated from the sputtering target elements. The interaction of the sputtered atoms or clusters of atoms and the molecular species or complexing chemical species or agents causes the formation of a metastable complex which can be considered as an intermediate precursor, i.e., a carrier of the ultimate elements that are desired in the target film or layer. By changing the character of the atoms or clusters of atoms ejected from the target through reaction and inclusion in molecular or atomic clusters, ultimate film conformality on the substrate topographies is enhanced since the resulting metastable complexes or clusters have a reduced sticking coefficient and therefore increased surface mobility compared to the direct "line of flight" associated with sputtered species. In alternative terms, a precursor may be formed in the vapor phase above the substrate (between the substrate and the sputtering target) or on the substrate surface with a reduced binding affinity or sticking coefficient with the substrate. As practiced in an alternating or concurrent mode, a displaceable, disposable, or dispensable adsorbed intermediate atomic or molecular layer may be formed on the substrate that interferes with and modifies the binding affinity of the substrate interrogating species that were generated in the sputtering regime. In either case, this leads to the deposition of conformal thin films as compared with thin films grown by sputtered species deposited on the native substrate, while allowing increased flexibility, greater diversity, and higher multiplicity in the composition of the film grown on the substrate.

This specification also discloses that providing thermal energy to the substrate through direct heating or another form of energy transfer assists in reducing the coefficient of the metastable complexes to the substrate surface, thus increasing their mobility. By reducing their binding affinity upon physical or chemical adsorption to the substrate surface, thin films having improved conformality is achieved. In this respect, the present disclosure provides that the substrate temperature is adjusted in order to create a low energy environment that facilitates the surface mobility of the metastable species below the thermal threshold for immediate complete decomposition upon substrate surface impingement. In this respect, the low energy environment may cause the removal of one or more atomic or molecular clusters, species, or ligands from the metastable complexes, without affecting their surface mobility or, alternatively, leading to further enhancement in their surface mobility. Preferred substrate temperatures are in the range from 100 to 650° C., and more preferably from 200 to 350° C. as previously described.

This specification also discloses that providing thermal energy to the sputtering target through direct heating or another form of energy transfer assists in enhancing the reactivity of the sputtered atoms, clusters of atoms, or ions generated from the sputtering target with the CVD, ALD, MLD, SAM, and/or Click precursors and molecular species, either in the vapor phase above the substrate (between the substrate and the sputtering target) or on the substrate surface. This results in increasing the efficiency of the reactions to generate metastable complexes and, as a result, the concentration of metastable complexes. Preferred target temperatures for all methods described herein are in the range from 100 to 650° C., and more preferably from 200 to 350° C., including all intervening temperatures.

It is within the scope of the disclosure to apply a direct current (DC), pulsed direct current (PDC), or alternating current (AC) bias current to the substrate prior to or subsequent substrate heating step, and prior to the precursor introduction and plasma formation. This current may assist in reducing the sticking coefficient of the metastable complexes to the substrate surface, thus increasing their mobility while reducing their binding affinity upon physical or chemical adsorption to the substrate surface and consequently further assisting in not only achieving deposition of conformal thin films but also in the growth of films with smooth morphology and reduced surface roughness. Preferred DC or PDC bias voltages are in the range of −25V to −1000V and more preferably −100V to −250V. Preferred AC bias frequencies and voltages are in the range of 25V to 1000V and 25 Hz to 1000 Hz, respectively, and more preferably 50V to 250V and 50 Hz to 500 Hz, respectively.

The present disclosure is also distinct and separate from the concept of reactive sputtering, in which reactive gases are used to sputter multi-component compounds. In reactive sputtering, the sputtered particles from a target material undergo a chemical reaction with a gaseous reactant, aiming to deposit a film with a different composition from the target on a certain substrate. The chemical reaction that the particles undergo is with a reactive gas introduced into the sputtering chamber, such as oxygen or nitrogen, enabling the production of oxide and nitride films, respectively. The reaction occurs in the vapor phase above the substrate, leading to the deposition of a binary or ternary compound on the substrate in the same direct line of sight approach as standard sputtering. As a contrasting example, in the methods according to the present disclosure, the elemental composition of the target may have the same elemental composition as the film deposited on the substrate. In reactive sputtering, the elemental composition of the target is substantially different than that of the film deposited on the substrate.

A further difference is that reactive sputtering suffers from the same shortcomings as standard sputtering, including the failure to follow the contours of features, especially those features that can be described as asperities, cavities, vias, channels, or recesses in the substrate. As explained earlier, the methods described herein are designed to address this problem through the generation or introduction of a precursor that can be formed in the vapor phase or on the substrate surface. This precursor is designed to interact with the sputtered atoms or ions to produce species with a reduced binding affinity with the substrate. Alternatively, it is devised as a displaceable, disposable, or dispensable adsorbed layer on the substrate that reacts with the sputtered particles impinging on the substrate, thus interfering with their binding affinity and leading to increased mobility and higher motion of the resulting reactants. In either case, this leads to greater conformality compared to direct sputtered species deposited on the native substrate, while allowing for increased flexibility, greater diversity, and higher multiplicity in the composition of the film grown on the substrate.

The present disclosure solves the four challenges associated with reactive sputtering. For one, reactive sputtering is limited to multi-component materials, while the hybrid growth process of the current disclosure may be employed to grow single-, dual-, or multi-element films. Furthermore, it is well known to those of ordinary skill in the art that reactive sputtering suffers from is what is commonly known as "target poisoning," which occurs as a result of the reactive gas interacting with the target to form impure and/or undesirable materials or substances which adhere to and contaminate the target, thus "poisoning" the target and causing arcing or delaying and inhibiting the emission of sputtered atoms and species and negatively impacting the entire sputtering process. A further limitation of reactive sputtering is what is universally known as the "vanishing or disappearing anode." This effect is caused by constant coverage of the anode (including deposition chamber walls, substrate holder, and target shield) by a continuous, non-conducting or highly resistive coating that results from the reaction of the sputtered particles with the reactive gas. The covered areas stop acting as part of the anode, leading the plasma to engage other higher conductivity locations within the sputtering system that are increasingly farther away to sustain itself, thus greatly reducing the power, efficiency, and usefulness of the plasma and, consequently, the sputtering process. These problems are compounded by the formation of an undesirable hysteresis loop due to different elemental sputtering rates from targets consisting of two elements, a metal and an insulator. It is well known to those of ordinary skill in the art that traditional attempts at resolving these issues are complex, time-consuming, and introduce additional steps in the sputtering process such as two target pre-conditioning steps.

It has been discovered that these issues may be eliminated by designing and implementing a set of related innovative solutions, including providing a specifically-tailored or tightly-engineered molecular structure, "precursor synthon," reagent, or reactant in the vapor phase that is either chemically neutral or inert with respect to the sputtering target or does not react with the sputtering target, except perhaps if and when it forms an adsorptive monolayer or multi-layer on the sputtering target at typical operating temperatures or at temperatures below about 100° C.; introducing these species in the vapor phase at a pre-determined optionally adjustable distance in proximity of the substrate and at a remote distance from the target; controlling the processing parameters to ensure a pressure differential in the deposition chamber to limit the diffusion of these vapor species to the target; and using single element sputtering targets since the reaction with the specifically-tailored "precursor synthon" or reagent or reactant or in vapor phase or on the substrate surface to yield a metastable complex in the space between the target and the substrate that is characterized by high surface mobility, leading to the formation a stable adsorbed layer or thin film upon the metastable complex impinging on the substrate surface.

In some embodiments described herein, the manufacturing technique is one of a combination of sputtering and CVD, sputtering and ALD, sputtering and MLD, sputtering and SAM deposition, and/or sputtering and Click deposition.

Embodiments of the present disclosure may be applied in any manufacturing process in any industrial setting, including, but not limited to, the semiconductor (computer chip), optoelectronic, aircraft, energy, sensor, medical, biological, chemical, and defense industrial sectors.

Further, it will be understood by those skilled in the art that one or more of the above-described embodiments may be employed with known chemical precursors, including organic, inorganic, metal-organic and organometallic precursors. Further, it will be understood by those skilled in the art that one or more of the above-described embodiments may be employed with any fully coordinated chemical compound, non-fully coordinated chemical compound, molecular cluster or fragment, ionic species, precursor synthon, reagent, and/or reactant, and the system/method of the present disclosure.

The novel hybrid growth processes or integrated physical-chemical deposition processes according to the present disclosure, also enable the in-situ synthesis or generation and consumption of precursors through the reaction of sputtered ions, atoms and/or molecular clusters with any fully coordinated chemical compound, non-fully coordinated chemical compound, molecular cluster or fragment, ionic species, precursor synthon, reagent, and/or reactant, either in the vapor phase above the substrate or directly on the substrate surface. The integrated physical-chemical processes described herein therefore permit the in-situ synthesis and use of chemicals and precursors that are too unstable at room temperature or those that require significant cooling to retain their integrity prior to being used. Through its combined physical and chemical reactions, the present disclosure also enables the formation or volatilization of new and unconventional precursors and chemicals that are not yet on the market and are not currently used in manufacturing.

The sputtering processes described herein may be selected from, for example and without limitation, the group consisting of direct current (DC) sputtering, radio frequency (RF) sputtering, magnetron sputtering, ion beam sputtering (IBS), ion-assisted sputtering deposition, high-target-utilization sputtering (HiTUS), high-power impulse magnetron sputtering (HiPIMS), and gas flow sputtering.

Further, the sputtering processes described herein may employ remote or direct plasma generation. The sputtering plasma power densities are maintained at from about 0.1 W/cm$^2$ to 1000 W/cm$^2$, and preferably from about 0.5 W/cm$^2$ to about 250 W/cm$^2$, and more preferably from about 1 W/cm$^2$ to about 50 W/cm$^2$.

The sputtering gas is selected from, for example and without limitation, known inert gases such as helium, neon, argon, krypton, and xenon. The sputtering gas flow rate is maintained at from about 1 to about 5000 sccm, and more preferably from about 25 to about 250 sccm. It also includes coordinating gases that may be used directly for sputtering, such as carbon monoxide and nitrogen oxides but are most often used as mixtures with inert gases.

The term "working pressure" or "operating pressure" is well understood in the art to signify the pressure at which the various gas (vapor) phase and surface induced reactions and deposition occur. Typical operating pressures in the reaction zone (deposition chamber), also referred to as working pressure, are maintained at about 0.1 mtorr to about 760 torr, and preferably from about 1 mtorr to about 100 torr, and more preferably from about 10 mtorr to about 10 torr.

The novel hybrid growth processes or integrated physical-chemical deposition processes described herein may require, in some cases, a pressure differential in the deposition chamber as additional means to control the mobility and diffusion of vapor species between the sputtering target and the substrate. The pressure differential may be set at ratio from about 1.1:1 to about 20:1 (higher pressure near the sputtering target), and preferably from about 1.5:1 to about 10:1, and more preferably from about 2:1 to about 5:1. It will be understood by those skilled in the art that the pressure differential may be achieved, for example and without limitation, through control of the flows of the sputtering gas and the precursor synthon, reagent, and/or reactant; and/or through the use of one or more pumping manifolds.

In general, relatively low-activation energy (low plasma power density) sputtering modes are preferred to eject single atoms rather than clusters of atoms. Of note is that gas (vapor) phase or substrate surface interactions in which sputtered atoms, ions, or molecular clusters are "surrounded" or "coordinated" or "coupled" to the CVD, ALD, ALCVD, MLD and/or Click precursor, molecular cluster, reagent, and/or reactant, will significantly facilitate their migration on the substrate surface or movement on the substrate surface. Consistent with this effect, the hybrid growth processes and integrated physical-chemical deposition processes of the present disclosure do minimize or eliminate any undesirable effects resulting from low density sputtering targets or sputtering targets with granular structure, such as peel off and emission of large clusters of atoms or worse, sizeable particles.

Contrary to reactive sputtering, the sputtering gas is designed to reach the target preferentially versus the precursor or synthon. By way of example, and in one chamber configuration, because Ar is heavier than CO, the physical distance and separation of the two types of entities (i.e., the sputtering gas and precursor or synthon) is important, with sputtering gas introduced closer to the target and the precursor or synthon introduced closer to the substrate. However, in the case of a precursor or synthon such as Cu(hexafluoroacetylacetonate) (HFAC), the separation distance is less critical, since the root-mean-square (RMS) velocity of HFAC is much slower than Ar.

The invention will now be described in connection with the following non-limiting examples.

Example 1 (Prophetic): Deposition of Conformal and Pure Nickel Thin Films

As shown in FIG. 1, a silicon substrate 2 with nanoscale trenches and vias is introduced into a deposition system 101 and a Ni sputtering target 4 is also placed into the chamber in magnetron sputtering gun 102. The distance between the target and substrate can be adjusted mechanically or electrically through controlled motions of the substrate holder and sputtering target. The chamber is subsequently pumped down to a vacuum of $\leq 10^{-6}$ torr using pumping manifold (system) 103 to ensure that the chamber is appropriately purged and evacuated to eliminate any residual atmospheric contaminants. The substrate is then heated by heater 104 to a pre-determined temperature of about 175° C. to about 250° C. and maintained at that temperature for the duration of the Ni film growth process. At this stage, a flow of carbon monoxide (CO) as a reactive or catalytic precursor is initiated concomitant with the opening of valve 105 in proximity to the substrate at a flow of 50 sccm, as controlled by mass flow controller (MFC) 106. Concurrently, argon gas is introduced into the deposition chamber with the opening of valve 107 in proximity to the sputtering gun at a flow of about 100 sccm to about 1000 sccm, as controlled by mass flow controller (MFC) 108. The argon gas and system in general should be free of any hydrogen. A 2:1 pressure differential is maintained in the distance between the sputtering gun and the substrate by pumping manifolds (systems) 103 and 109, with a pressure of about 1000 mtorr near the target and about 500 mtorr near the substrate. An argon plasma 6 is then formed using the DC or RF power 8 at a power density of about 1 to about 5 W/cm$^2$ and Ni atoms and ions sputtering is initiated and directed towards the carbon monoxide region above the substrate to react and form a nickel carbonyl complex in the vapor phase above the substrate. The nickel carbonyl complex subsequently impinges on the substrate and decomposes to yield pure Ni. The deposition cycle is stopped when the Ni film reaches the desired final thickness. The ratio of carbon monoxide both entering and/or leaving the deposition chamber; the ratio of argon both entering and/or leaving the deposition chamber; the plasma power density; the relative distance between substrate and target; and the pressure differential across the distance from target to substrate can be controlled and adjusted to achieve optimum rates of deposition and optimum nickel film properties.

Figure 2:
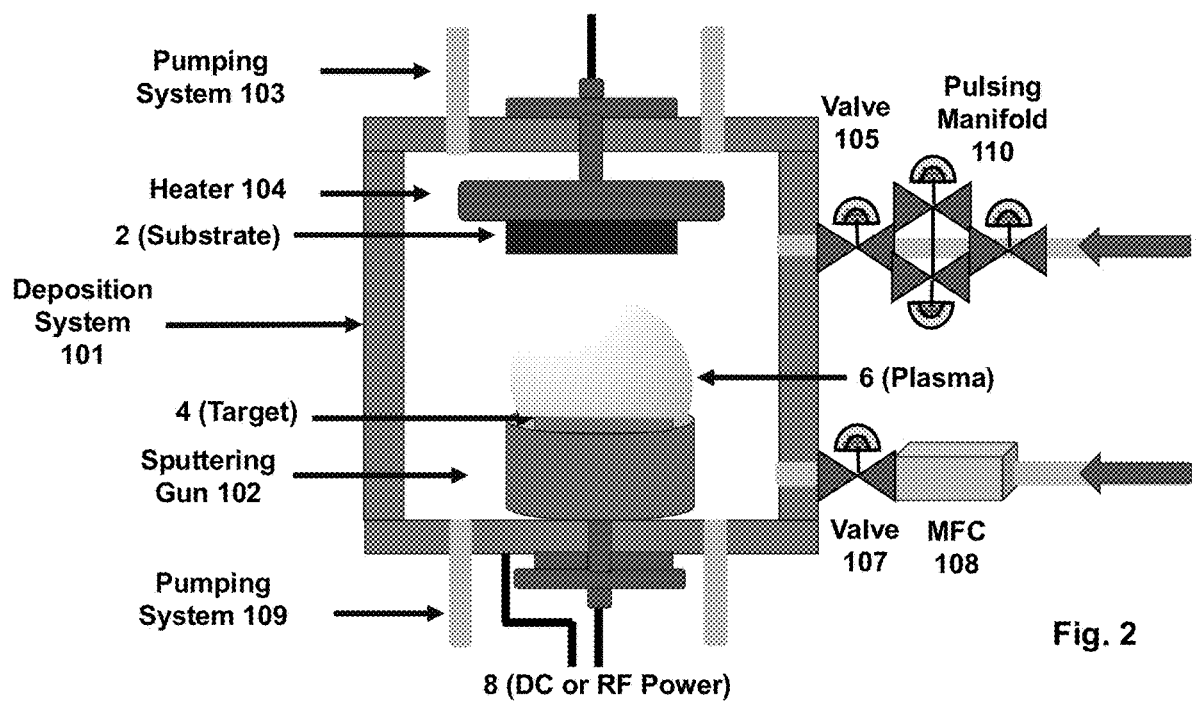
FIG. 2 is a schematic of a combined sputtering/ALD deposition system in accordance with a second embodiment of the disclosure.

Example 2 (Prophetic): Deposition of Conformal and Pure Silicon Nitride Thin Films As shown in FIG. 2, a patterned silicon substrate 2 is introduced into a deposition system 101 and a Si sputtering target 4 is also placed into the chamber in magnetron sputtering gun 102. The distance between the target and substrate may be adjusted mechanically or electrically through controlled motions of the substrate holder and sputtering target. The chamber is subsequently pumped down to a vacuum of $\leq 10^{-6}$ torr using pumping manifold (system) 103 to ensure that the chamber is appropriately purged and evacuated to eliminate any residual atmospheric contaminants. The substrate is then heated by heater 104 to a pre-determined temperature of about 175° C. to about 400° C. and maintained at that temperature for the duration of the SiN film growth process. At this stage, step 1 of the deposition cycle begins by exposing the substrate to an ALD surface treatment by opening valve 105 and activating the pulsing manifold 110 and subjecting the substrate to a pulse of about 0.1 second to about 5 seconds exposure to hydrazine or hydrazoic acid as reactive or catalytic precursor to form a monolayer or "near-zero-thickness" layer of radical nitrogen species and nitrogen molecular structures with uniform step coverage in substrate patterned structures and topographies. The hydrazine or hydrazoic acid pulse is followed by a nitrogen or argon pulse of about 0.2 second to about 10 seconds of an inert to remove reaction byproducts from the deposition system. Step 2 of the deposition cycle is then initiated by introducing argon gas into the deposition chamber with the opening of valve 107 in proximity of the sputtering gun at a flow of about 100 sccm to 500 sccm, as controlled by mass flow controller (MFC) 108. An argon plasma 6 is then formed using the DC or RF power 8 at a power density of about 1 to about 5 W/cm$^2$ and Si atoms and ions sputtering is activated and directed towards the substrate to react with the adsorbed radical nitrogen species and nitrogen molecular structures to form metastable complexes of the type SiHN with reduced sticking coefficient and higher mobility than sputtered Si atoms and ions. The SiHN metastable species subsequently decompose to yield a SiN monolayer on the substrate. The sputtering process is then discontinued by shutting off the plasma. Steps 1 and 2 are repeated as many times as required until the SiN film reaches the desired final thickness. The ratio of hydrazine or hydrazoic acid both entering and/or leaving the deposition chamber; the ratio of argon both entering and/or leaving the deposition chamber; the plasma power density; the relative distance between substrate and target; and the pressure differential across the distance from target to substrate can be controlled and adjusted to achieve optimum rates of deposition and optimum SiN film properties.

Example 3 (Prophetic): Deposition of Conformal and Pure Cobalt Thin Films

Under analogous conditions to Example 1, with a cobalt sputtering target employed instead of a nickel sputtering target, pure and conformal cobalt films are formed.

Example 4 (Prophetic): Deposition of Conformal and Pure Tungsten Thin Films

Under analogous conditions to Example 1, with a tungsten sputtering target employed instead of a nickel sputtering target, pure and conformal tungsten films are formed.

Example 5 (Prophetic): Deposition of Conformal and Pure Tungsten Thin Films

As shown in FIG. 1, a silicon substrate with nanoscale trenches and vias 2 is introduced into a deposition system 101 and a W sputtering target 4 is also placed into the chamber in magnetron sputtering gun 102. The distance between the target and substrate can be adjusted mechanically or electrically through controlled motions of the substrate holder and sputtering target. The chamber is subsequently pumped down to a vacuum of $\leq 10^{-6}$ torr using pumping manifold (system) 103 to ensure that the chamber is appropriately purged and evacuated to eliminate any residual atmospheric contaminants. The substrate is then heated by heater 104 to a pre-determined temperature of about 175° C. to about 500° C. and maintained at that temperature for the duration of the W film growth process. At this stage, a flow of a mixture of Ar and CO (5-25% CO concentration in the mixture acting as reactive or catalytic precursor) is initiated concomitant with the opening of valve 107 in proximity of the sputtering gun at a flow of about 100 sccm to about 1000 sccm, as controlled by mass flow controller (MFC) 108. The argon gas and the deposition system are free of any hydrogen as its presence could lead to the formation of tungsten carbide on the target and elsewhere in the deposition chamber. A 2:1 pressure differential is maintained in the distance between the sputtering gun and the substrate by pumping manifolds (systems) 103 and 109, with a pressure of about 1000 mtorr near the target and about 500 mtorr near the substrate. An (Ar+CO) plasma 6 is then formed at a power density of about 1 to about 5 W/cm$^2$ and W atoms and ions sputtering is initiated and directed towards the towards the substrate. The W atoms and ions complex with CO and form tungsten carbonyl metastable species in the vapor phase above the substrate. The W carbonyl species subsequently impinge on the substrate with reduced sticking coefficient and higher mobility than sputtered W atoms and ions and decompose to yield pure and conformal W. The deposition cycle is stopped when the W film reaches the desired final thickness. The ratio of carbon monoxide both entering and/or leaving the deposition chamber; the ratio of argon both entering and/or leaving the deposition chamber; the plasma power density; the relative distance between substrate and target; and the pressure differential across the distance from target to substrate can be controlled and adjusted to achieve optimum rates of deposition and optimum W film properties.

It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the present invention as defined by the appended claims.

We claim:

1. A physico-chemical method for depositing a conformal layer on a substrate, comprising:
   providing a substrate in a reactor;
   heating the substrate to a temperature of about 100° C. to about 650° C.;
   maintaining the substrate at about 100° C. to about 650° C.,
   providing a sputtering target in the reactor;
   introducing a chemical species into the reactor in the vapor phase above the substrate and/or on a substrate surface;
   wherein the chemical species is selected from the group consisting of diolefins, carbon monoxide, nitrogen monoxide, tertiary phosphines, tertiary amines, diketonates, hydrazine, dimethylhydrazine, and hydrazoic acid;
   ejecting single atoms or multi-atom clusters comprising up to three atoms from the sputtering target;
   causing the ejected single atoms or multi-atom clusters to interact with the chemical species in the vapor phase above the substrate and/or on the substrate surface;
   wherein the interaction forms a complex in the vapor phase and/or on the substrate surface;
   wherein the formation of the complex is due to or enabled by an energy transfer process, a remote or direct plasma application process, electron ionization, oxidation, and/or reduction;
   wherein the complex has a sticking coefficient S and a probability of desorption $P_d$ whose sum is about 0.01 to about 0.9; and
   forming a conformal layer from the complex on the substrate surface, wherein the conformal layer has the same elemental composition as the sputtering target.

2. The method according to claim 1, wherein the chemical species is a diolefin selected from the group consisting of butadiene, cyclooctadiene, vinylnorbornene, and cyclopentadiene.

3. The method according to claim 1, wherein the chemical species is a tertiary amine selected from the group consisting of trimethylamine and tetramethylethylenediamine.

4. The method according to claim 1, wherein the formation of the complex is due to or enabled by a remote or direct plasma application process having a plasma power density ranging from about 0.1 W/cm$^2$ to about 1000 W/cm$^2$.

5. The method according to claim 4, wherein the plasma power density ranges from about 1 W/cm$^2$ to about 50 W/cm$^2$.

6. The method according to claim 1, wherein the formation of the complex is due to or enabled by electron ionization at energy levels of about 1 eV or higher.

7. The method according to claim 6, wherein the electron ionization is at energy levels of about 2 eV to about 20 eV.

8. A physico-chemical method for depositing a conformal layer on a patterned substrate, the method comprising:

providing a patterned substrate in a reaction zone of a deposition chamber;

providing a sputtering target in the reaction zone of the deposition chamber;

heating the substrate to a temperature of about 100° C. to about 650° C.;

maintaining the substrate at about 100° C. to about 650° C., performing a chemically reactive vapor deposition step comprising treating the patterned substrate with a single chemically reactive vapor deposition cycle by exposing the patterned substrate to a pulse of a precursor that physisorbs or chemisorbs on a surface of the patterned substrate to form a conformal catalytic or reactive monolayer or near-zero-thickness layer on the substrate surface;

wherein the precursor is selected from the group consisting of diolefins, carbon monoxide, nitrogen monoxide, tertiary phosphines, tertiary amines. diketonates, hydrazine, dimethylhydrazine, and hydrazoic acid:

forming a plasma of an inert or reactive gas between the sputtering target and the substrate;

performing a sputtering step by using the plasma to sputter a single element or a binary compound from the sputtering target onto the monolayer or near-zero-thickness layer on the substrate;

reacting the sputtered single element or binary compound with the catalytic or reactive monolayer or near-zero-thickness layer on the substrate surface to form a metastable complex;

wherein the formation of the metastable complex is due to or enabled by an energy transfer process, a remote or direct plasma application process, electron ionization, oxidation. and/or reduction;

wherein the metastable complex has a sticking coefficient S and a probability of desorption $P_d$ whose sum is about 0.01 to about 0.9; and performing a surface-induced process to convert the metastable complex to a conformal layer on the patterned substrate.

9. The method according to claim 8, wherein the chemically reactive vapor deposition and sputtering steps are repeated sequentially, simultaneously, or alternately until a conformal thin film of a predetermined thickness is achieved.

10. The method according to claim 8, wherein the surface-induced process is selected from energy transfer from the substrate, a remote or direct plasma application, electron ionization, oxidation, and/or reduction.

11. The method according to claim 8, further comprising exposing the substrate to a pulse of an inert or reactive gas prior to forming the plasma to remove reaction byproducts from the deposition chamber.

12. The method according to claim 11, wherein the inert gas is selected from the group consisting of neon, argon, xenon, and krypton.

13. The method according to claim 11, wherein the reactive gas is selected from the group consisting of nitrogen, hydrogen, carbon monoxide, carbon dioxide, ammonia, hydrazine, and hydrogen azide.

14. The method according to claim 8, wherein the substrate is selected from the group consisting of silicon, silicon dioxide, silicon nitride, silicon carbide, silicon-germanium alloys, germanium, gallium, gallium nitride, cobalt, ruthenium, platinum, silver, platinum, gold, nickel, copper, platinum, titanium, alumina (sapphire), aluminum, aluminum nitride, titanium nitride, titanium carbide, tantalum, and tantalum nitride.

15. The method according to claim 8, wherein a working pressure in the reactor during the vapor deposition step ranges from about 0.0001 torr to about 760 torr.

16. The method according to claim 8, wherein the chemically reactive vapor deposition step consists of one or more of ALD, ALCVD, CVD, MLD, SAM, or CLICK.

17. The method according to claim 8, wherein the precursor is a diolefin selected from the group consisting of butadiene, cyclooctadiene, vinylnorbornene, and cyclopentadiene.

18. The method according to claim 8, wherein the precursor is a tertiary amine selected from the group consisting of trimethylamine and tetramethylethylenediamine.

19. A physico-chemical method for depositing a conformal layer on a patterned substrate, the method comprising:

providing a patterned substrate in a reaction zone of a deposition chamber;

providing a sputtering target in the reaction zone of the deposition chamber;

heating the substrate to a temperature of about 100° C. to about 650° C.;

maintaining the substrate at about 100° C. to about 650° C., introducing a reactive or catalytic precursor, reagent, or reactant in a vapor phase into the reaction zone of the deposition chamber;

wherein the reactive or catalytic precursor, reagent, or reactant is selected from the group consisting of diolefins, carbon monoxide, nitrogen monoxide, tertiary phosphines, tertiary amines, diketonates, hydrazine, dimethylhydrazine, and hydrazoic acid;

forming a plasma of an inert or reactive gas between the sputtering target and the substrate;

performing a sputtering step by using the plasma to sputter a unary or a binary compound from the sputtering target which reacts with the precursor, reagent, or reactant in the vapor phase to form at least one metastable complex;

wherein the formation of the at least one metastable complex is due to or enabled by an energy transfer process, a remote or direct plasma application process, electron ionization, oxidation, and/or reduction;

delivering the at least one metastable complex to a substrate surface where the at least one metastable complex physisorbs or chemisorbs with a reduced sticking coefficient or higher mobility than the sputtered unary or binary compound;

wherein the at least one metastable complex has a sticking coefficient S and a probability of desorption $P_d$ whose sum is about 0.01 to about 0.9; and performing a surface-induced process to convert the at least one metastable complex to a conformal layer on the substrate, wherein when the sputtering target comprises a single element, the conformal layer comprises a unary or binary compound, and when the sputtering target comprises a binary element, the conformal layer comprises a binary or ternary compound.

20. The method according to claim 19, wherein the sputtering step and the surface induced process are performed concurrently until the conformal layer on the substrate reaches a desired thickness on the substrate.

21. The method according to claim 19, wherein the precursor is a fully coordinated chemical compound, a non-fully coordinated compound, a molecular fragment, or an ionic species.

22. The method according to claim 19, wherein the reactive or catalytic precursor, reagent, or reactant is a diolefin selected from the group consisting of butadiene, cyclooctadiene, vinylnorbornene, and cyclopentadiene.

23. The method according to claim 19, wherein the reactive or catalytic precursor, reagent, or reactant is a tertiary amine selected from the group consisting of trimethylamine and tetramethylethylenediamine.

24. A physico-chemical method for depositing a conformal compound on a patterned substrate, the method comprising:
   providing a patterned substrate in a reaction zone of a deposition chamber, the patterned substrate comprising at least one region having a first chemical composition and at least one region having a second chemical composition;
   providing a sputtering target in the reaction zone of the deposition chamber;
   heating the substrate to a temperature of about 100° C. to about 650° C.;
   maintaining the substrate at about 100° C. to about 650° C.,
   introducing and reacting molecular structures or precursors on a surface of the substrate to selectively form a reactive or catalytic monolayer, near-zero-thickness layer, or seed layer on the patterned substrate overlaying only the region having the first chemical composition;
   wherein the molecular structures or precursors are selected from the group consisting of diolefins, carbon monoxide, nitrogen monoxide, tertiary phosphines, tertiary amines, diketonates, hydrazine, dimethylhydrazine, and hydrazoic acid;
   forming a plasma of an inert or reactive gas between the sputtering target and the substrate;
   performing a sputtering step by using the plasma to sputter a unary, single element, or binary compound from the sputtering target on the patterned substrate;
   wherein the sputtered element or compound reacts with the reactive or catalytic monolayer, near-zero thickness layer, or seed layer to convert through a surface-induced process and selectively forms a conformal binary or ternary compound overlaying only the region having the first chemical composition; and
   wherein the conformal sputtered element or compound deposits only on the region having the second chemical composition.

25. The method according to claim 24, wherein the sputtering step is repeated until both the binary or ternary compound and the sputtered element or compound reach a desired thickness.

26. The method according to claim 24, wherein the molecular structures or precursors are introduced and reacted using ALD, CVD, ALCVD, MLD, SAM, and/or CLICK.

27. The method according to claim 24, wherein the molecular structures or precursors are diolefins selected from the group consisting of butadiene, cyclooctadiene, vinylnorbornene, and cyclopentadiene.

28. The method according to claim 24, wherein the molecular structures or precursors are tertiary amines selected from the group consisting of trimethylamine and tetramethylethylenediamine.

* * * * *